United States Patent
Kamatani

(10) Patent No.: US 10,326,387 B2
(45) Date of Patent: Jun. 18, 2019

(54) PHASE DETECTING DEVICE, MOTOR SYSTEM, IMAGE FORMING APPARATUS, CONVEYANCE DEVICE, AND SENSOR LEVEL OBTAINING METHOD

(71) Applicant: Tomohiko Kamatani, Osaka (JP)

(72) Inventor: Tomohiko Kamatani, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 5 days.

(21) Appl. No.: 15/656,110

(22) Filed: Jul. 21, 2017

(65) Prior Publication Data

US 2018/0041148 A1 Feb. 8, 2018

(30) Foreign Application Priority Data

Aug. 5, 2016 (JP) .................................. 2016-155072

(51) Int. Cl.
*H02P 6/14* (2016.01)
*H02P 6/16* (2016.01)
*G01R 31/34* (2006.01)
*H02K 11/20* (2016.01)

(52) U.S. Cl.
CPC .............. *H02P 6/14* (2013.01); *G01R 31/343* (2013.01); *H02K 11/20* (2016.01); *H02P 6/16* (2013.01)

(58) Field of Classification Search
None
See application file for complete search history.

(56) References Cited

U.S. PATENT DOCUMENTS

| 2013/0106326 | A1 | 5/2013 | Kamatani et al. |
| 2013/0106327 | A1* | 5/2013 | Kamatani ................. H02P 6/16 318/400.06 |
| 2014/0265111 | A1* | 9/2014 | Ishizuka .................. B65H 7/02 271/265.01 |
| 2015/0253159 | A1 | 9/2015 | Kamatani |
| 2015/0256328 | A1* | 9/2015 | Kamatani ............. H04L 7/0054 375/226 |
| 2016/0094211 | A1 | 3/2016 | Tani et al. |
| 2016/0349083 | A1* | 12/2016 | Guo ......................... G01D 5/20 |
| 2016/0365815 | A1 | 12/2016 | Furuse et al. |
| 2016/0370746 | A1 | 12/2016 | Tatebe et al. |

FOREIGN PATENT DOCUMENTS

JP 2013-099022 5/2013

* cited by examiner

*Primary Examiner* — Eduardo Colon Santana
*Assistant Examiner* — Zemenay T Truneh
(74) *Attorney, Agent, or Firm* — Harness, Dickey & Pierce, P.L.C.

(57) ABSTRACT

A phase detecting device includes a signal level detector configured to detect a first level of a signal according to a phase of a rotor of a motor, a level memory configured to store the first level of the signal preliminarily detected at each phase of the rotor as a second level of the signal at the phase of the rotor, and a phase detector configured to detect the phase of the rotor based on the second level of the signal inputted from the signal level detector.

9 Claims, 14 Drawing Sheets

| PHASE (ELECTRICAL ANGLE) | SECOND LEVEL |
|---|---|
| 0 | 0.000 |
| 1 | 0.018 |
| 2 | 0.035 |
| 3 | 0.052 |
| ... | ... |

| PHASE (ELECTRICAL ANGLE) | SECOND LEVEL |
|---|---|
| 90 | 1.100 |
| 450 | 1.200 |
| 810 | 0.900 |
| ... | ... |

PHASE DETECTING DEVICE, MOTOR SYSTEM, IMAGE FORMING APPARATUS, CONVEYANCE DEVICE, AND SENSOR LEVEL OBTAINING METHOD

CROSS-REFERENCE TO RELATED APPLICATION

This patent application is based on and claims priority pursuant to 35 U.S.C. § 119(a) to Japanese Patent Application No. 2016-155072, filed on Aug. 5, 2016, in the Japan Patent Office, the entire disclosure of which is hereby incorporated by reference herein.

BACKGROUND

Technical Field

Embodiments of the present disclosure relate to a phase detecting device, a motor system, an image forming apparatus, a conveyance device, and a sensor level obtaining method.

Related Art

Controlling a rotation of a motor involves detecting a phase (angle) of a rotor of the motor. A method to detect the phase of the rotor of the motor is known, in which a sensor, which outputs a sensor signal with a signal level according to the phase of the rotor, is disposed around the rotor to detect the phase of the motor based on the signal level. In the method, the signal level output by the sensor and a reference signal level at predetermined per phase are compared to detect the phase of the rotor.

SUMMARY

An improved phase detecting device according to an embodiment of the present disclosure includes a signal level detector configured to detect a first level of a signal according to a phase of a rotor of a motor, a level memory configured to store the first level preliminarily detected at each phase of the rotor as a second level at the phase, and a phase detector configured to detect the phase of the rotor based on the second level at the phase.

further, there is provided a method for obtaining a sensor level to detect the phase of the rotor of the motor.

The method includes detecting the first level of a signal according to the phase of the rotor of the motor at predetermined time intervals during constant speed rotation of the motor, storing the first level preliminarily detected at the predetermined time intervals as the second level at each phase of the rotor, and detecting the phase of the rotor based on the second level.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figures 1, 2:
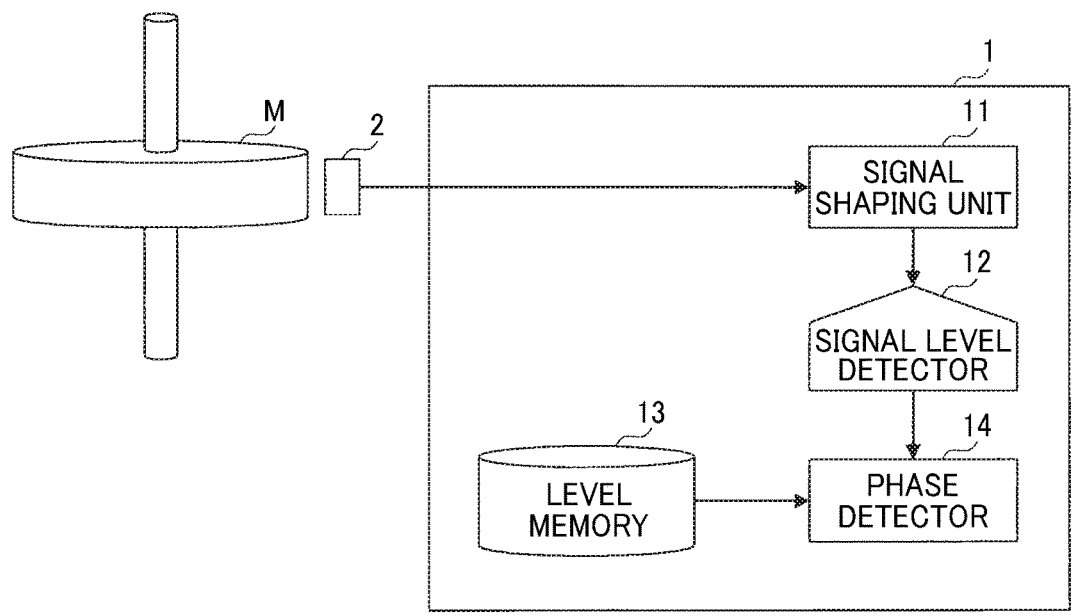
FIG. 1 is a schematic block diagram illustrating an example of a phase detecting device according to a first embodiment of the present disclosure.
FIG. 2 illustrates an example of a level table used in the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views. Redundant descriptions of components appended with the same reference numerals may be omitted.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Referring now to the drawings, wherein like reference numerals designate identical or corresponding parts throughout the several views thereof, and particularly to FIG. 1, a phase detecting device according to embodiments of the present disclosure is described. As used herein, the singular forms "a", "an", and "the" are intended to include the plural forms as well, unless the context clearly indicates otherwise.

A phase detecting device 1 according to a first embodiment is described with reference to FIGS. 1 to 6. FIG. 1 is a schematic block diagram illustrating an example of the phase detecting device 1 according to the first embodiment. The phase detecting device 1 in FIG. 1 detects a phase of a rotor of a motor M based on an output signal by a sensor 2 (hereinafter, referred to as a sensor signal). In FIG. 1, arrows indicate a flow of signals when the motor M is used. First, the motor M and the sensor 2 are described below.

The motor M is a direct-current (DC) motor such as a two-phase brushless DC motor and a three-phase brushless DC motor, but not limited thereto. The motor M includes a stator and the rotor. The stator includes a two-phase coil or a three-phase coil. An electric power supplied to the coil of the stator rotates the rotor.

The rotor includes, for example, a permanent magnet and is equipped with one or more magnetic pole pairs (pair of a south pole and a north pole). In the following description, the number of the magnetic pole pairs of the rotor is K. The motor M in FIG. 1 is an outer rotor type, but the motor M can also be an inner rotor type.

The sensor 2 is a magnetic sensor such as a Hall element and outputs a sensor signal in response to magnetic flux density. The sensor 2 is disposed around the rotor of the motor M. As the rotor of the motor M rotates, the magnetic flux density at the sensor 2 varies in response to the phase (angle) of the rotor. Therefore, the sensor signal responds to the phase of the rotor. In other words, the sensor signal varies in response to the phase of the rotor.

Hereinafter, an angle when one rotation of the rotor is 360 degrees is referred to as a mechanical angle. An angle when one cycle of the sensor signal is 360 degrees is referred to as an electrical angle. As the sensor 2 outputs K cycle sensor signal by one rotation of the rotor, the electrical angle is K times the mechanical angle. In the description below, the phase is presented in the electrical angle unless otherwise noted.

Next, descriptions are given below of a configuration of the phase detecting device 1. As illustrated in FIG. 1, the phase detecting device 1 includes a signal shaping unit 11, a signal level detector 12, a level memory 13, and a phase detector 14.

The signal shaping unit 11 is circuitry that accepts the sensor signal from the sensor 2 and shapes a waveform of the input sensor signal, to generate a shaped signal. The signal shaping unit 11 includes amplifier circuitry to amplify the sensor signal in order to correspond to an input range of the signal level detector 12 and filter circuitry to remove noise superimposed on the sensor signal. The signal shaping unit 11 inputs the shaped signal to the signal level detector 12.

The signal level detector 12 detects a level (amplitude) of the shaped signal input from the signal shaping unit 11. The level detected by the signal level detector 12 is referred to as a first level. The signal level detector 12 includes an analog to digital (AD) converter to convert the shaped signal, which is an analog signal, input from the signal shaping unit 11 into a digital signal. Thus, the first level is an AD converted value of the amplitude of the shaped signal. Any AD converter such as flash type, pipeline type, and delta sigma type AD converters may be used for the signal level detector 12. The signal level detector 12 inputs the first level to the phase detector 14.

A level memory 13 stores the first level preliminarily detected at each phase of the rotor of the motor M. The first level stored in the level memory 13 is referred to as a second level. The second level is obtained after assembling the motor M but before using the motor M. The second level is preferably obtained in the manufacturing process after assembling the motor M. An obtaining method for the second level is described in further detail later. The level memory 13 includes a memory such as a flash memory and an electrically erasable programmable read-only memory (EEPROM)

FIG. 2 illustrates an example of a level table stored in the level memory 13. As illustrated in FIG. 2, the level table includes the second level and the phase (electrical angle) of the rotor of the motor M correlated to each other and is stored in the level memory 13. In FIG. 2, the second level is stored at every degree, but an interval of the phase at which the second level is stored is arbitrary.

The phase detector 14 detects the phase of the rotor of the motor M at detection of the first level based on the first level input from the signal level detector 12 and the second level stored in the level memory 13. More specifically, the phase detector 14 detects the phase that corresponds to the second level closest to the first level as the phase of the rotor of the motor M at the detection of the first level. For example, when the first level is 0.052, the phase detector 14 detects the phase as 3 degrees with reference to the level table in FIG. 2. The phase detector 14 outputs the detected phase. Alternatively, the phase detector 14 can linearly interpolate the second level to calculate the phase corresponding to the first level, and detect the calculated phase as the phase of the first level. The phase output from the phase detector 14 is used in control drive circuitry of the motor M and the like.

Figure 3:
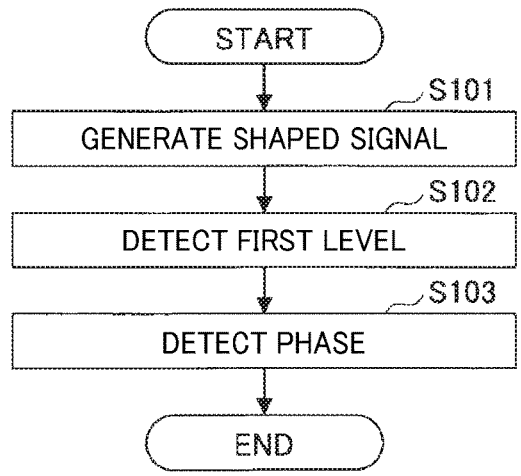
FIG. 3 is a flowchart of a process of detecting a phase according to the present disclosure.

Next, descriptions are given below of operation of the phase detecting device 1. FIG. 3 is a flowchart of a process of detecting the phase by the phase detecting device 1. The flowchart in FIG. 3 illustrates the process of detecting the phase of one cycle. The phase detecting device 1 executes the process of detecting the phase in FIG. 3 at predetermined time intervals during use of the motor M. The time interval to execute the process of detecting the phase is set according to an operation clock of the phase detecting device 1. The sensor 2 outputs the sensor signal constantly during use of the motor M.

At the timing of executing the process of detecting the phase, the signal shaping unit 11 samples the sensor signal, shapes the sampled sensor signal by predetermined shaping processing (amplification or filtering), and generates the shaped signal (step S101). The signal shaping unit 11 inputs the generated shaped signal to the signal level detector 12.

The signal level detector 12 accepts the shaped signal, converts the accepted shaped signal from analog to digital, and detects the AD converted value as the first level (step S102). The signal level detector 12 inputs the first level to the phase detector 14.

The phase detector 14 accepts the first level and detects the phase of the rotor with reference to the level table stored in the level memory 13 (step S103). The phase detector 14 outputs the detected phase. Then, the phase detecting device 1 is on standby for next execution of the process of detecting the phase.

Figure 4:
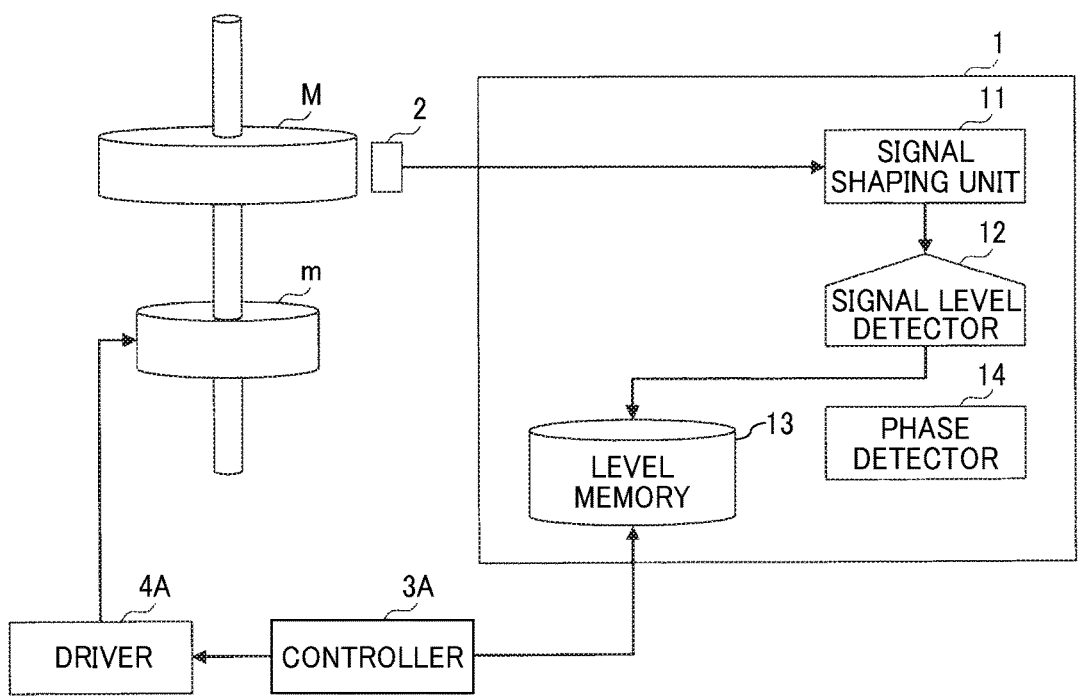
FIG. 4 is a schematic block diagram illustrating an example of the phase detecting device for explaining a first obtaining method for a second level.

In the present embodiment, the first obtaining method for obtaining a second level is described. FIG. 4 is a schematic block diagram illustrating an example of the phase detecting device for explaining the first obtaining method for the second level. In FIG. 4, arrows indicate a flow of signals during a process of obtaining the second level. In the first obtaining method, the phase detecting device 1, the sensor 2, an external motor m, a controller 3A, and a driver 4A are used to obtain the second level.

The external motor m is able to control the phase of the rotor and coaxially coupled to the motor M. The external motor m is preferably a hybrid stepping motor capable of phase control with high accuracy. Thus, the phase of the motor M coaxially coupled to the external motor m can be controlled with high accuracy. The external motor m is controlled by the controller 3A.

The controller 3A is control circuitry for the external motor m. The controller 3A can control the phase of the rotor of the external motor m to an arbitrary phase by the control signal. The control signal output from the controller 3A is input to a driver 4A. In addition, the controller 3A is connected to the level memory 13 and inputs a writing instruction to the level memory 13.

The driver 4A is drive circuitry for the external motor m. The driver 4A drives the external motor m according to the control signal input from the controller 3A.

Figure 5:
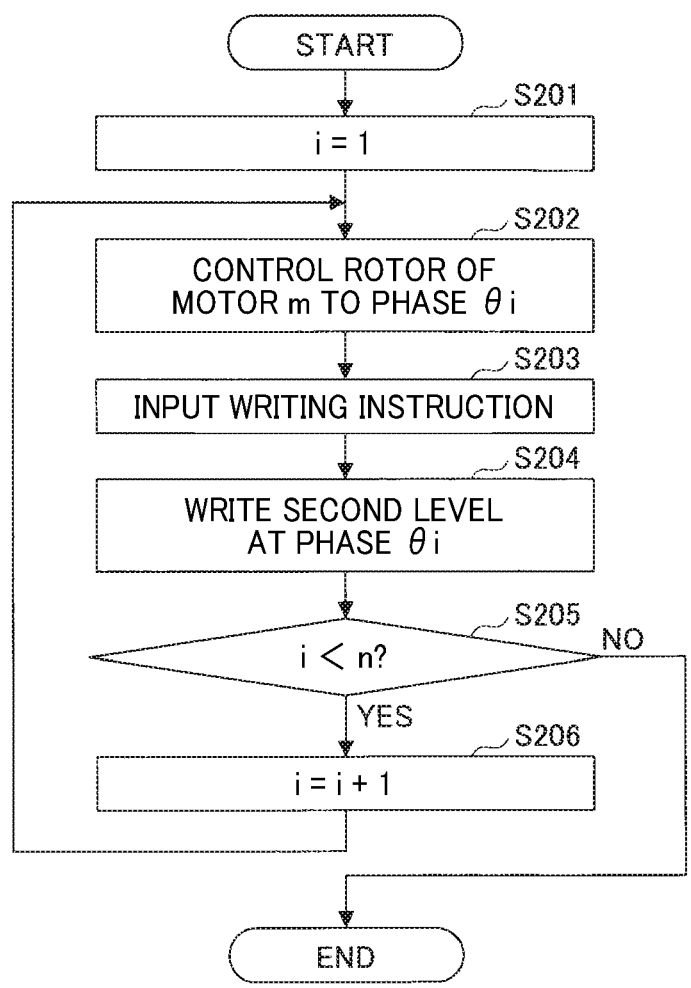
FIG. 5 is a flowchart of a process of obtaining the second level according to the first embodiment of the present disclosure.

FIG. 5 is a flowchart of the process of obtaining the second level according to the present embodiment. The obtaining process is executed after assembling the motor M but before using the motor M. Descriptions are given below of obtaining the second levels at predetermined phases θi (the number of the predetermined phases θi is "n", and i=1 to n) of the rotor of the motor M. The sensor 2, the signal shaping unit 11, and the signal level detector 12 are in operation during the obtaining process. The signal level detector 12 inputs the detected first level to the level memory 13 each time the signal level detector 12 detects the first level.

When the first obtaining process starts, the controller 3A initializes i to 1 (step S201). Here, i represents the number of the phase θ to obtain the second level. The phase θ (the ordinal number is "i") is referred to as the phase θi.

Next, the controller 3A controls the phase of the rotor of the external motor m to the phase θi (step S202). Accordingly, the phase of the rotor of the motor M coaxially coupled to the external motor m becomes the phase θi.

When the phase of the rotor of the external motor m (motor M) becomes the phase θi, the controller 3A inputs the writing instruction to the level memory 13 (step S203).

When the level memory 13 accepts the writing instruction, the level memory 13 writes the first level input from the signal level detector 12 as the second level at the phase θi to the level table (step S204). Thus, the second level at the phase θi is stored in the level memory 13.

If i is smaller than n ("YES" in step S205), or there is a phase θi for which the second level is not obtained, the controller 3A adds 1 to i (step S206). After that, the process returns to step S202.

Subsequently, the process in steps S202 to S206 is repeated until i is equal to n. If i is equal to n ("NO" in step S205), in other words, the second level is obtained for all the phases θi, the controller 3A ends the first obtaining process.

With this process, the second levels at the phases θi (i=1 to n) are respectively obtained and stored in the level memory 13. After the process described above, when the motor M is used, the phase of the rotor of the motor M is detected based on the second level obtained by the first obtaining process.

Figure 6:
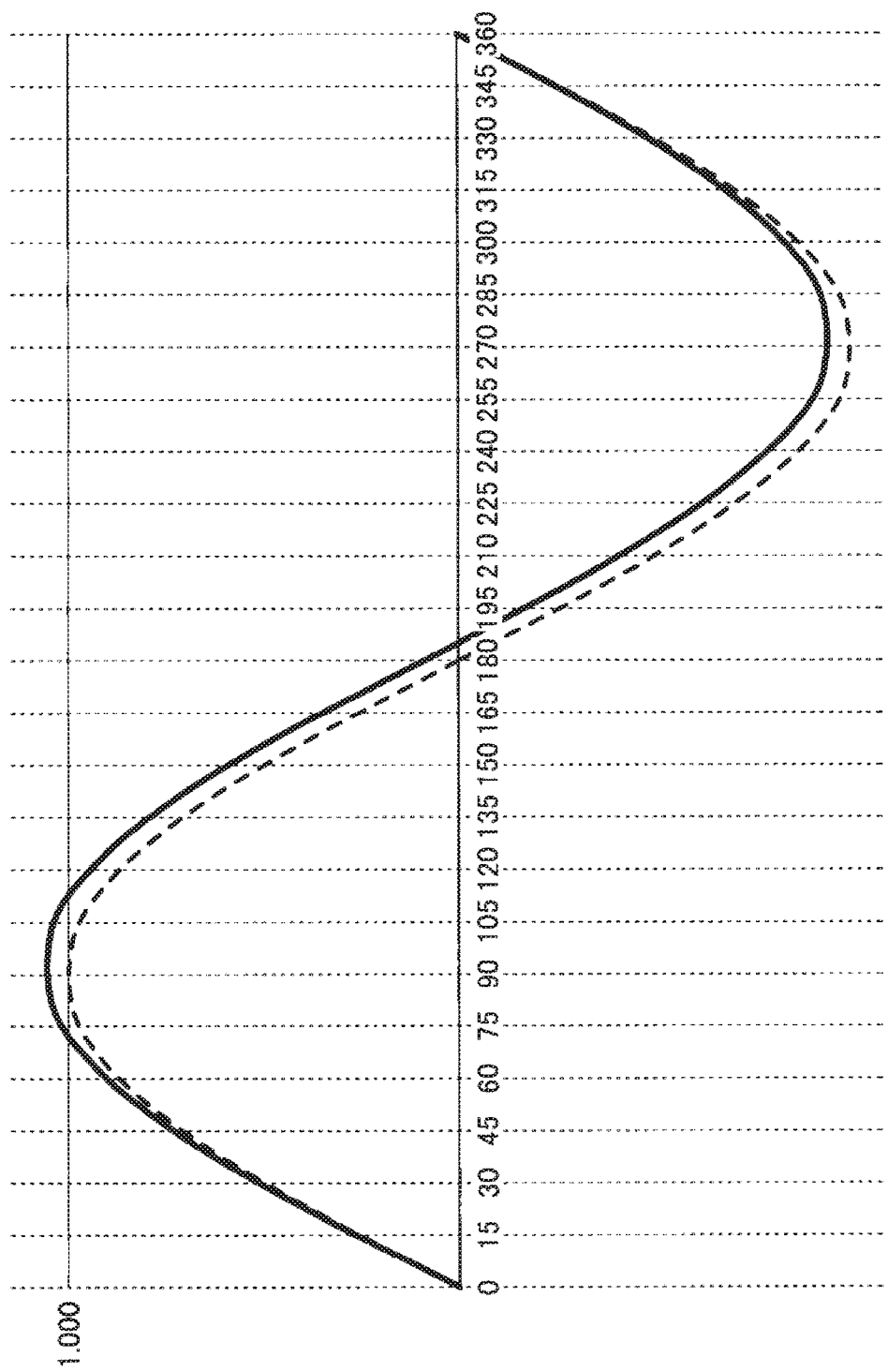
FIG. 6 is a graph illustrating an example of a shaped signal.

FIG. 6 is a graph illustrating an example of the shaped signal. In FIG. 6, a vertical axis represents the first level, and a horizontal axis represents the phase of the rotor of the motor M. FIG. 6 illustrates one shaped signal cycle. A solid line represents an actual shaped signal, and a broken line represents an ideal shaped signal. In FIG. 6, the ideal shaped signal is a sine wave.

As illustrated in FIG. 6, when the ideal shaped signal (sine wave) is obtained by the signal shaping unit 11, the first level at 90 degrees is 1.000. In a comparative phase detecting device that operates on the basis that the signal is the ideal sine wave, 1.000 is stored as the first level at 90 degrees. As a result, when the comparative phase detecting device detects 1.000 as the first level, the comparative phase detecting device detects 90 degrees as the phase of the rotor.

However, the actual shaped signal is different from the ideal signal due to production tolerances as illustrated in FIG. 6. For example, the first level of the actual shaped signal at 90 degrees is greater than 1.000 in FIG. 6. As the comparative phase detecting device does not consider waveform deviation, the phase detected based on the first level causes a phase detection error.

Correction circuitry for correcting the shaped signal minimizes the phase detection error, but the correction circuitry increases manufacturing cost of the phase detecting device 1 or increases the circuitry area. In addition, it is difficult to eliminate the phase detection error even if the correction circuitry is provided.

By contrast, in the present embodiment, the first level of the actual shaped signal is detected at each phase of the rotor of the motor M, and the detected first level is stored as the second level in the level memory 13. Therefore, the phase detecting device in the present embodiment can minimizes the effect of the production tolerances of the motor M and can detect the phase of the rotor of the motor M accurately. In the present embodiment, since the correction circuitry is unused, the phase detection accuracy is improved, and the increase in manufacturing cost of the phase detecting device 1 and the increase in circuitry area are minimized.

A phase detecting device 1 according to a second embodiment is described with reference to FIGS. 7 and 8. The configuration of the phase detecting device 1 according to the second embodiment is similar to the first embodiment. However, in the present embodiment, a second obtaining method for the second level is described.

Figure 7:
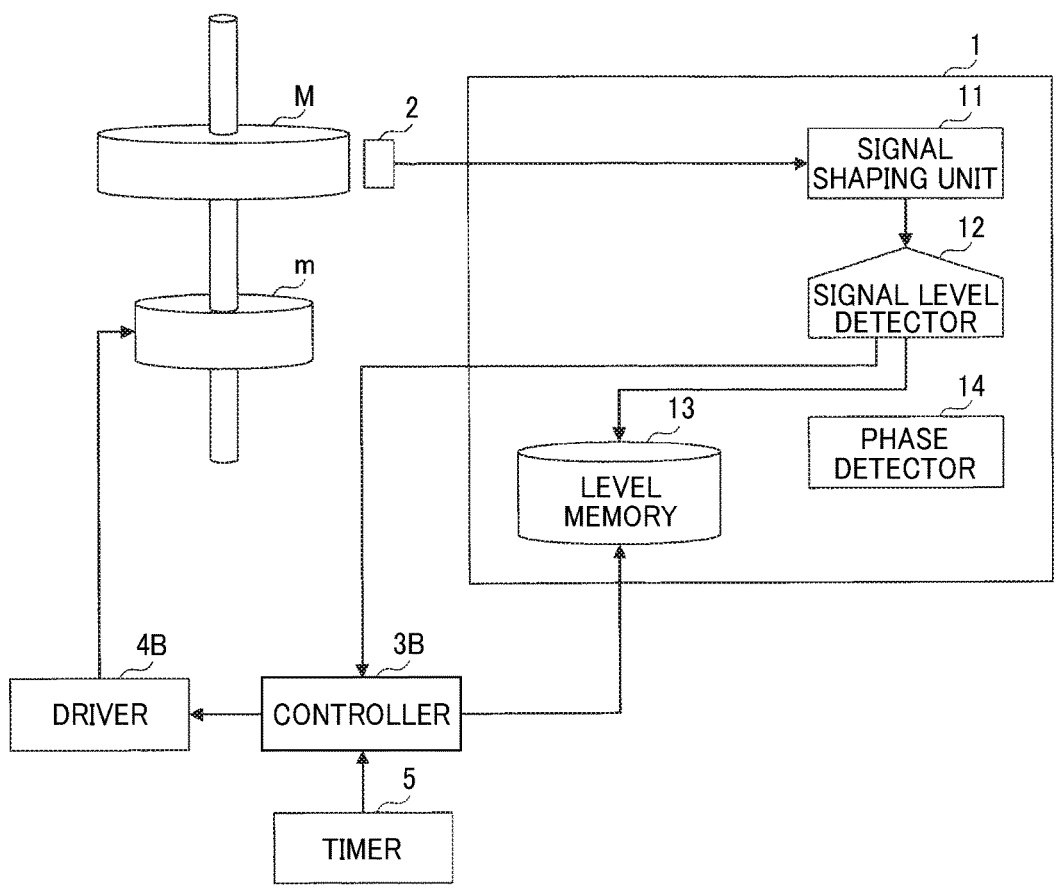
FIG. 7 is a schematic block diagram illustrating an example of a phase detecting device for explaining a second obtaining method for a second level.

FIG. 7 is a schematic block diagram illustrating an example of the phase detecting device 1 for explaining a second obtaining method for the second level. In FIG. 7, arrows indicate a flow of signals during a process of obtaining the second level. In the second obtaining method, the phase detecting device 1, the sensor 2, the external motor m, a controller 3B, a driver 4B, and a timer 5 are used to obtain the second level.

The external motor m is coaxially coupled to the motor M. The external motor m is preferably a brushless DC motor or a brush DC motor capable of constant speed rotation with high accuracy. Thus, the phase of the motor M coaxially coupled to the external motor m can be controlled with high accuracy. The external motor m is controlled by the controller 3B.

The controller 3B is control circuitry for the external motor m. The controller 3B can rotate the rotor of the motor m at constant speed by the control signal. The control signal output from the controller 3B is input to the driver 4B. In addition, the controller 3B is connected to the level memory 13 and inputs the writing instruction to the level memory 13.

The driver 4B is drive circuitry for the external motor m. The driver 4B drives the external motor m according to the control signal input from the controller 3B.

The timer 5 measures time and inputs the measured time to the controller 3B. The timer 5 may be installed in the phase detecting device 1.

Figure 8:
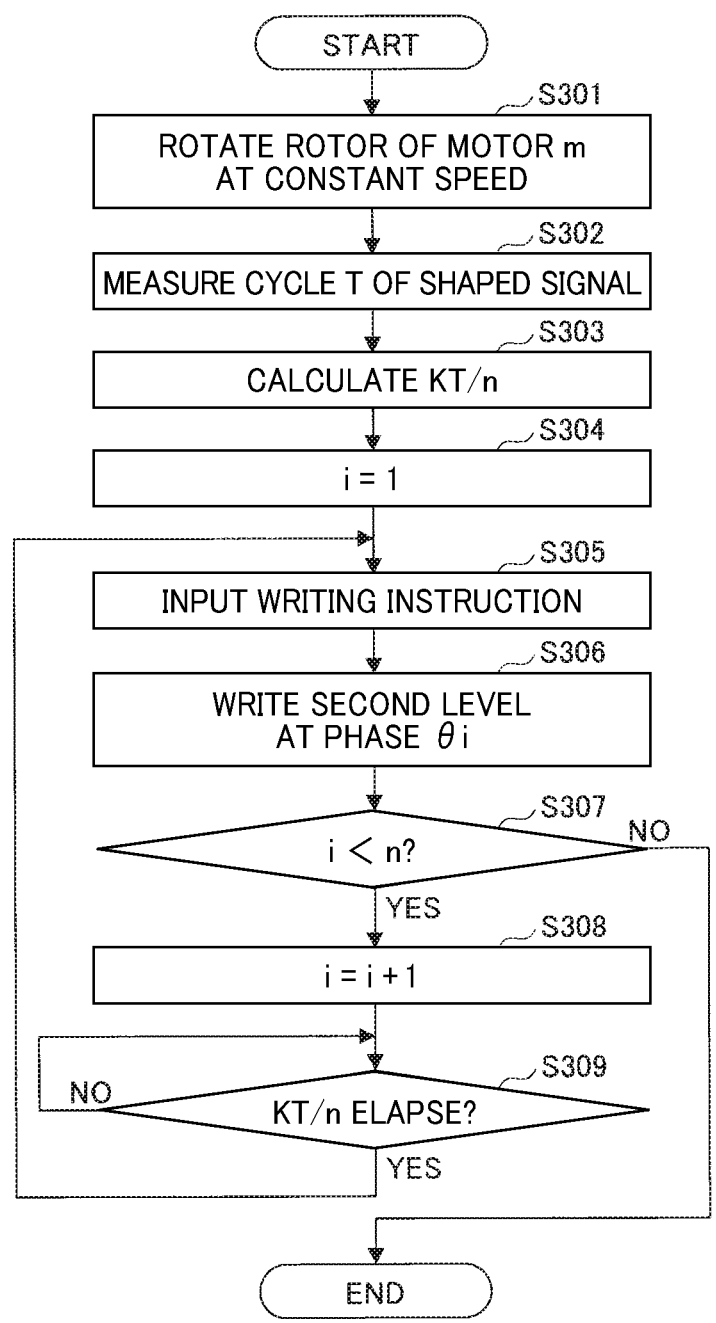
FIG. 8 is a flowchart of a process of obtaining the second level according to the second embodiment of the present disclosure.

FIG. 8 is a flowchart of the process of obtaining the second level according to the present embodiment. The obtaining process is executed after assembling the motor M but before using the motor M. Descriptions are given below of obtaining the second levels at n predetermined phases θi (i=1 to n) of the rotor of the motor M. The sensor 2, the signal shaping unit 11, the signal level detector 12, and the timer 5 are constantly in operation during the obtaining process. Each time the signal level detector 12 detects the first level, the signal level detector 12 inputs the detected first level to the controller 3B and the level memory 13.

When the obtaining process starts, the controller 3B starts the constant speed rotation of the rotor of the external motor m (step S301). Accordingly, the rotor of the motor M coaxially coupled to the external motor m starts to rotate at the constant speed.

Next, the controller 3B measures a cycle T of the shaped signal based on the first level input from the signal level detector 12 and the time input from the timer 5 (step S302). The controller 3B measures the time from a first input of a certain value of the first level to a third input of the value as the cycle T. When the number of magnetic pole pairs K is known, the controller 3B can measure the K-cycle time and divides the measured time by the number of magnetic pole pairs K to calculate the cycle T. With such a manner for obtaining the cycle T, a waveform error of the shaped signal is averaged and the cycle T is measured accurately.

Measuring the cycle T, the controller 3B calculates a time KT/n (step S303). The time KT/n is equivalent to the time until the phase of the rotor of the motor M that rotates at the constant speed changes from the ith phase θi to the (i+1)th phase θi+1.

Subsequently, the controller 3B initializes i to 1 (step S304). When the controller 3B initializes i, the controller 3B inputs the writing instruction to the level memory 13 (step S305).

When the level memory 13 accepts the writing instruction, the level memory 13 writes the first level input from the signal level detector 12 as the second level at the phase θi in the level table (step S306). Thus, the second level at the phase θi is stored in the level memory 13.

If i is smaller than n ("YES" in step S307), or there is the phase θi for which the second level is not obtain, the controller 3B adds 1 to i (step S308). Then, the controller 3B stands by until the time KT/n elapses from the input time of the writing instruction in step S305 ("NO" in step S309).

When the time KT/n elapses from the input time of the writing instruction in step S305 ("YES" in step S309), the process returns to step S305, and the controller 3B inputs the writing instruction to the level memory 13 again (step S305).

Subsequently, the process in steps S305 to S309 is repeated until i is equal to n. If i is equal to n ("NO" in step S307), in other words, the second level is obtained for all the phase θi, the controller 3B ends the obtaining process.

With this process, the respective second levels at the predetermined phases θi (i=1 to n) are respectively obtained at the predetermined intervals (time KT/n) and stored in the level memory 13. When the use of the motor M is started, the phase of the rotor of the motor M is detected based on the second level obtained by the first obtaining process.

As described above, in the present embodiment, the second level can be obtained at intervals of the time KT/n. As the motor M rotates at constant speed during the obtaining process, the obtained second level is equivalent to the second level at the phase θi at intervals of 360K/n. Here, 360K/n is a minimum phase angle that the phase detecting device 1 can detect. As illustrated in FIG. 2, in the case of K=1 and n=360, the second level is detected every degree. Thus, in the present embodiment, the second level at each phase θi of the rotor of the motor M can be detected preliminarily.

Therefore, the phase detecting device 1 in the present embodiment can minimize the effect of the production tolerances of the motor M and can detect the phase of the rotor of the motor M accurately similar to the first embodiment. In the present embodiment, since the correction circuitry is unused, the phase detection accuracy is improved, and the increase in manufacturing cost of the phase detecting device 1 and the increase in circuitry area are minimized.

Figure 9:
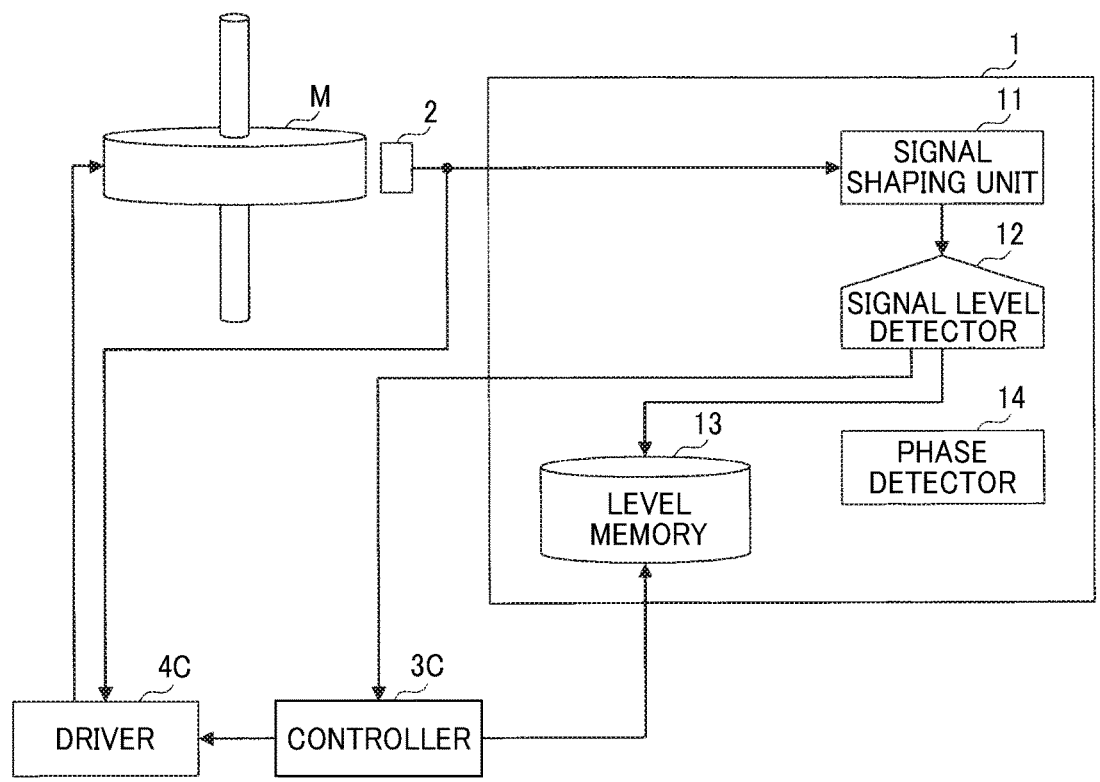
FIG. 9 is a schematic block diagram illustrating an example of a phase detecting device for explaining a third obtaining method for a second level.

A phase detecting device 1 according to a third embodiment is described with reference to FIGS. 9 and 10. The configuration of the phase detecting device 1 according to the third embodiment is similar to the first embodiment.

The phase detecting device 1 according to the present embodiment employs a third obtaining method for the second level. FIG. 9 is a schematic block diagram illustrating an example of the phase detecting device 1 for explaining the third obtaining method for the second level. In FIG. 9, arrows indicate a flow of signals during a process of obtaining the second level. In the third obtaining method, the phase detecting device 1, the sensor 2, a controller 3C, and a driver 4C are used to obtain the second level. In the present embodiment, the motor M is the DC motor.

The controller 3C is the control circuitry for the motor M. The controller 3C can rotate the rotor of the motor M in an uncontrolled manner (hereinafter "uncontrolled rotation") by the control signal. The term "uncontrolled manner" used here is to rotate the rotor without controlling the phase and speed of the rotor. When the motor M is the DC motor, the speed of the rotor of the motor M becomes almost constant in the uncontrolled rotation. In other words, the rotor of the motor M can be rotated at constant speed as well as the second embodiment. The control signal output from the controller 3C is input to the driver 4C. In addition, the controller 3C is connected to the level memory 13 and inputs the writing instruction to the level memory 13.

The driver 4C is drive circuitry for the motor M. The driver 4C drives the motor M according to the control signal input from the controller 3C. In more details, the driver 4C uses the sensor signal output from the sensor 2 as a communication signal to rotate the rotor of the motor M with uncontrolled rotation.

Figure 10:
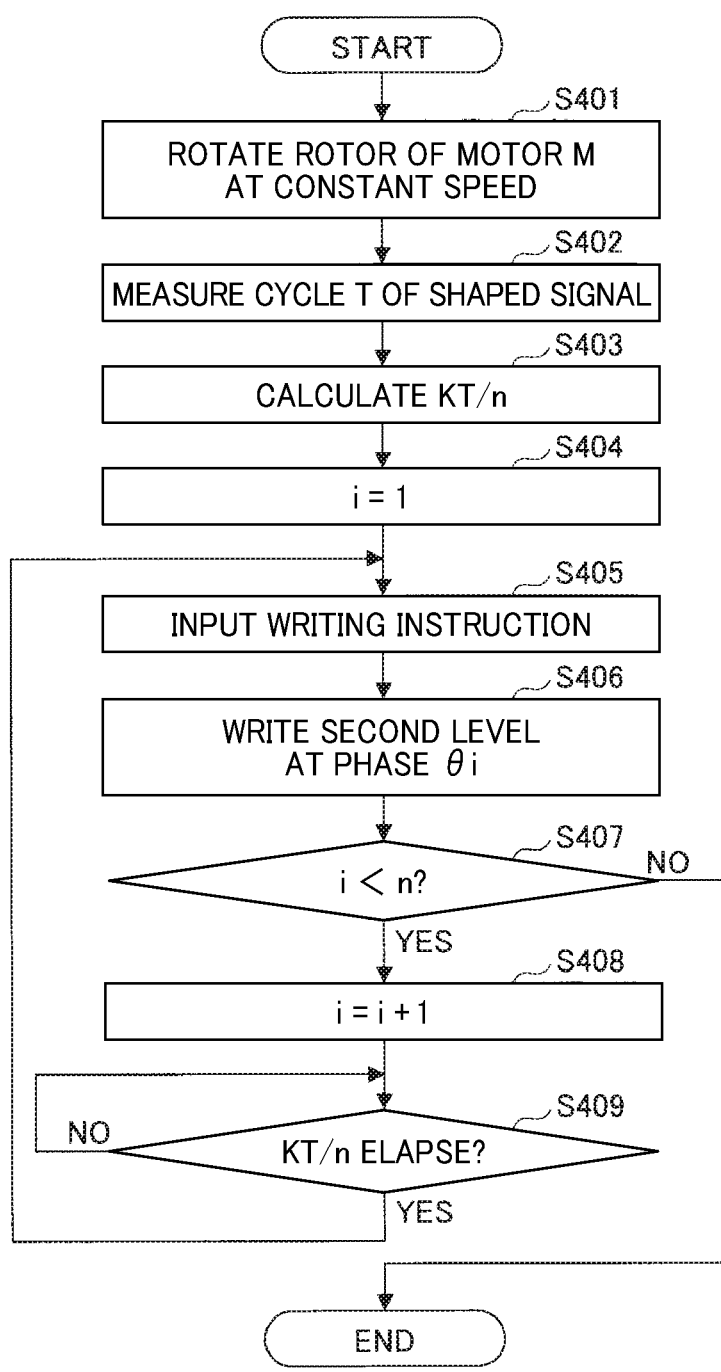
FIG. 10 is a flowchart of a process of obtaining the second level according to the third embodiment of the present disclosure.

FIG. 10 is a flowchart of the process of obtaining the second level according to the present embodiment. Steps from S402 to S409 in FIG. 10 are similar to the steps from S302 to S309 illustrated in FIG. 8. Step S401 is described below.

when the obtaining process starts, the controller 3C starts the uncontrolled rotation of the rotor of the motor M (step S401). Accordingly, the rotor of the motor M starts rotating at constant speed. In the second embodiment, the constant speed rotation of the external motor m rotates the rotor of the motor M at constant speed. On the other hand, in the present embodiment, the rotor of the motor M is directly rotated at constant speed. The process of the present embodiment after step S401 is similar to that of the second embodiment.

For the same reason as in the second embodiment, in the present embodiment, the second level at each phase θi of the rotor of the motor M can be detected preliminarily. Therefore, the phase detecting device 1 in the present embodiment can minimize the effect of the production tolerances of the motor M and can detect the phase of the rotor of the motor M accurately as well as the first embodiment. In the present embodiment, since the correction circuitry is unused, the phase detection accuracy is improved, and the increase in manufacturing cost of the phase detecting device 1 and the increase in circuitry area are minimized.

In the present embodiment, unlike the first and the second embodiments, since the external motor m is unnecessary, labor of the obtaining process is reduced. In addition, since the external motor m is unnecessary, if the controller 3C and the driver 4C are installed in the phase detecting device 1, the obtaining process can be performed at an arbitrary timing. Therefore, for example, the obtaining process can be easily performed every time the motor M is used.

A phase detecting device 1 according to a fourth embodiment is described with reference to FIGS. 11 to 14. In the present embodiment, descriptions are given below of the phase detecting device 1, which specifies a start point to detect the phase based on the peak of the sensor signal (shaped signal).

Figures 11, 12:
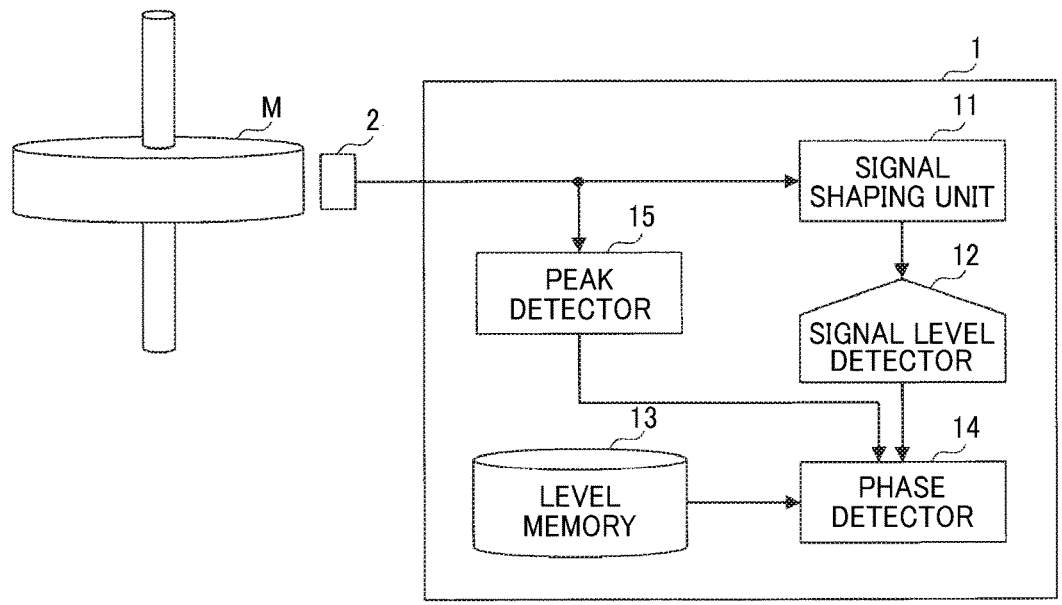
FIG. 11 is a schematic block diagram illustrating an example of a phase detecting device according to a fourth embodiment of the present disclosure.
FIG. 12 illustrates an example of a peak table used in the fourth embodiment of the present disclosure.

FIG. 11 is a schematic block diagram illustrating an example of a phase detecting device 1 according to the fourth embodiment. In FIG. 11, arrows indicate a flow of signals when the motor M is used. The phase detecting device 1 in FIG. 11 includes a peak detector 15. Otherwise, the configuration of the phase detecting device 1 according to the fourth embodiment is similar to the first embodiment.

The peak detector 15 is circuitry that accepts the sensor signal from the sensor 2 and detects a peak of the accepted sensor signal. When the peak detector 15 detects the peak of the sensor signal during use of the motor, the peak detector 15 notifies the phase detector 14 of the peak detection.

When the peak detector 15 detects the peak of the sensor signal during the obtaining process of the second level, the peak detector 15 also notifies the level memory 13 of the peak detection. When the level memory 13 is notified of the peak detection, the level memory 13 stores the second level and the phase at the time of the peak detection as the second level and the phase of the peak.

The detection of the peak of the sensor signal corresponds to the detection of the peak of the shaped signal. Accordingly, the peak detector 15 can accept the shaped signal from the signal shaping unit 11 and can detect the peak from the shaped signal.

FIG. 12 illustrates an example of a peak table stored in the level memory 13. As illustrated in FIG. 12, the peak table includes the second level and the phase of the peak in relation to each other. In FIG. 12, the second level of each peak is different from each other because it is assumed that a waveform of the shaped signal of each cycle is different, as described later. The level memory 13 may add a flag indicating the peak to the record corresponding to the peak in the level table instead of storing the peak table.

Figure 13:
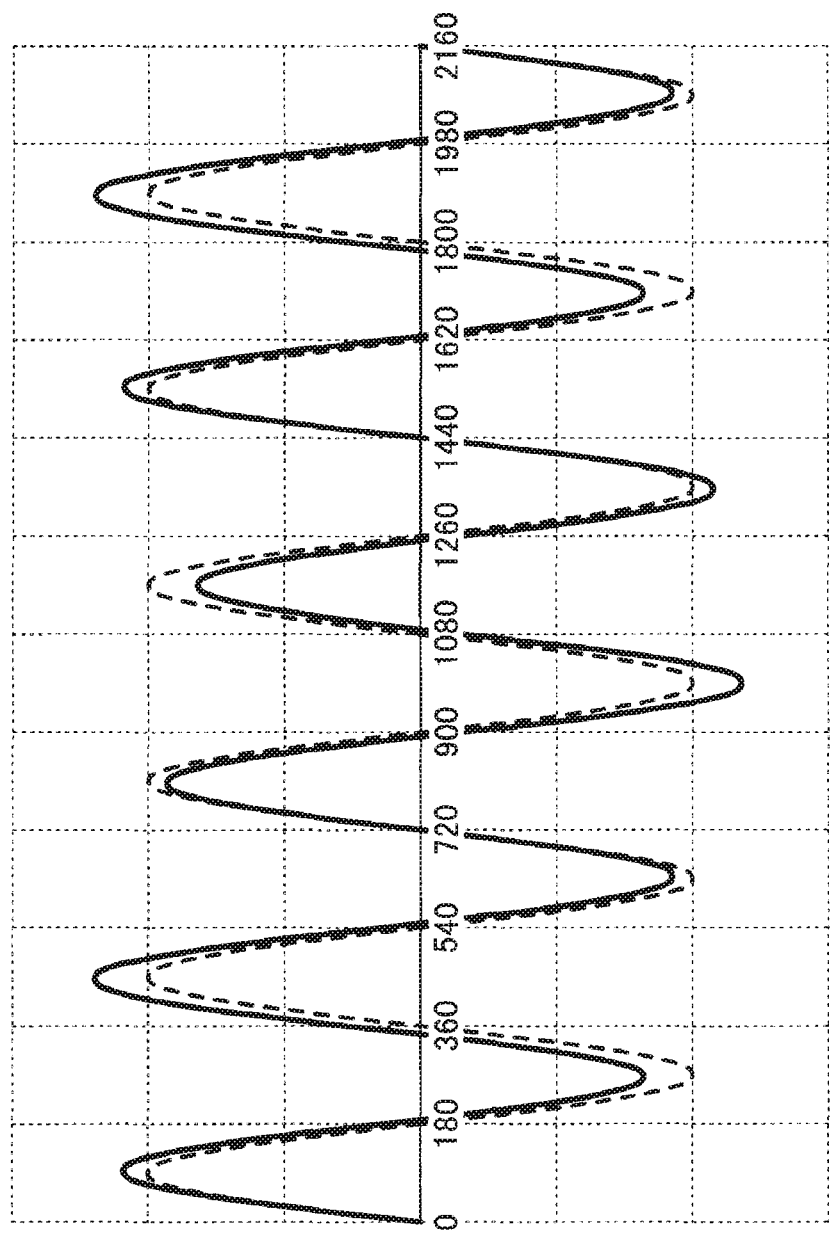
FIG. 13 is a graph illustrating an example of the shaped signal.

FIG. 13 is a graph illustrating an example of the shaped signal. In FIG. 13, the vertical axis represents the first level, and the horizontal axis represents the phase of the rotor of the motor M. FIG. 13 illustrates six cycles of the shaped signal. The solid line represents the actual shaped signal, and the broken line represents the ideal shaped signal. In FIG. 13, the ideal shaped signal is a sine wave.

When the rotor of the motor M includes a plurality of magnetic pole pairs, the waveform of the shaped signal of each cycle may be different as illustrated in FIG. 13 due to the production tolerances of the magnetic pole pair. When the waveform of the shaped signal of each cycle is different, it is preferable to specify the start point (phase) to start the phase detection.

This is because, as illustrated in FIG. 13, a plurality of phases having the same first level exists. For this reason, depending on what phase is the start point, the detected phase is different. If the right phase is determined as the start point, the phase of the rotor is detected accurately. By contrast, if the wrong phase is determined as the start point, the accuracy of the phase detection may decrease. As the plurality of phases having the same first level exists, it is difficult to specify which phase is the start point with the first level only.

The start point may be specified in the following method. For example, the phase of the rotor when the motor M stops is stored in the level memory 13, and the phase detector 14 uses the phase stored in the level memory 13 as the start point when the motor M is driven next. However, in the method, if the phase of the rotor is changed while the motor M is off, it is difficult to specify the start point.

In the present embodiment, the start point is specified with the peak of the sensor signal during the drive of the motor M. A method of specifying the start point according to the present embodiment is described below.

Figure 14:
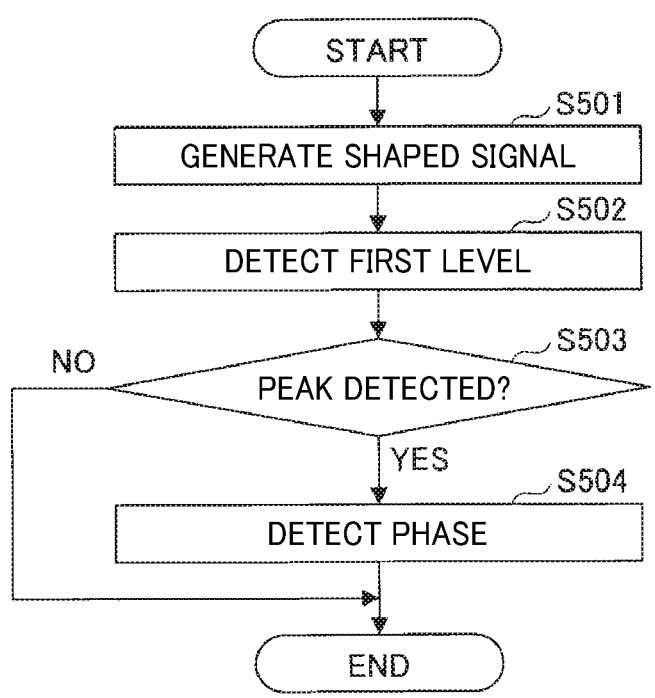
FIG. 14 is a flowchart of a process of specifying a start point.

FIG. 14 is a flowchart of a process of specifying the start point. The flowchart in FIG. 14 illustrates the specifying process for the one cycle. The phase detecting device 1 executes the specifying process in FIG. 14 at predetermined time intervals from the start of driving the motor M until the phase detecting process starts. The time interval to execute the specifying process is set according to the operation clock of the phase detecting device 1. The sensor 2 outputs the sensor signal and the peak detector 15 outputs the peak detection result during use of the motor M.

At the timing of executing the specifying process, the signal shaping unit 11 samples the sensor signal, shapes the sampled sensor signal by predetermined shaping processing, and generates the shaped signal (step S501). The signal shaping unit 11 inputs the generated shaped signal to the signal level detector 12.

The signal level detector 12 accepts the shaped signal, converts the accepted shaped signal from analog to digital, and detects the AD converted value as the first level (step S502). The signal level detector 12 inputs the first level to the phase detector 14.

If the peak detector 15 does not detect the peak ("NO" in step S503), in other words, the phase detector 14 is not notified of the peak detection by the peak detector 15, the phase detector 14 ends the specifying process. Then, the phase detecting device 1 stands by for next executing the specifying process.

On the other hand, if the peak detector 15 detects the peak ("YES" in step S503), or the phase detector 14 is notified of the peak detection by the peak detector 15, the phase detector 14 refers to the peak table. Then, the phase detector 14 detects the phase, which corresponds to the second level closest to the first level input from the signal level detector 12, as the phase of the rotor (step S504) and ends the specifying process. After the specifying process, the phase detector 14 starts the process of detecting the phase using the phase detected in step S504 as the start point. In other words, the phase detected in step S504 is specified as the start point.

As described above, in the present embodiment, the start point for the process of detecting the phase can be specified based on the second level and the phase of the peak of the sensor signal, and the peak detection result. The phase detecting device 1 in the present embodiment can detect the phase of the rotor of the motor M accurately by specifying the start point.

Furthermore, instead of the peak detector 15, the phase detecting device 1 in the present embodiment may include a bottom detector that detects a bottom of the sensor signal. In this case, a bottom table, in which the second level and the phase of the bottom are associated, is stored in the level memory 13. When the phase detector 14 is notified of the bottom detection by the bottom detector, the phase detector 14 refers to the bottom table, detects the phase that corresponds to the second level closest to the first level as the current phase, and starts the process of detecting the phase using the detected phase as the start point. In other words, the phase when the bottom is detected is specified as the start point.

The peak table can include the phase of each peak and a ranking of the second level magnitude of each peak in relation to each other. For example, in FIG. 13, the peaks of the second cycle (450 degrees) and the sixth cycle (1890 degrees) tie for first place, and the peaks of the first cycle (90 degrees) and the fifth cycle (1530 degrees) tie for third place. The peak of the third cycle (810 degrees) is fifth place, and the peak of the fourth cycle (1170 degrees) is sixth place.

As described above, by associating the phase and ranking of the peak, even when the levels of the shaped signal are different at the time of the obtaining process and the specifying process, the phase detector 14 can specify the start point.

More specifically, the phase detector 14 continues the specifying process during one rotation of the rotor and obtains the first level of each peak. Next, the phase detector 14 ranks each peak in order of the first level magnitude and obtains ranking pattern. The phase detector 14 can compare the obtained ranking pattern with the ranking stored in the peak table to specify the start point.

A phase detecting device 1 according to a fifth embodiment is described with reference to FIG. 15. Descriptions are given below of a shaped signal when a plurality of sensors 2 is installed in the present embodiment. The configuration of the phase detecting device 1 according to the fifth embodiment is similar to the first embodiment.

In the above-described embodiments, descriptions are given of the case where one sensor 2 is disposed around the motor M. When the sensor 2 is one, the one sensor signal is input to the signal shaping unit 11, and the shaped signal is the signal that is shaped from one sensor signal as illustrated in FIGS. 6 and 13.

By contrast, when the plurality of sensors 2 is disposed around the motor M, the plurality of sensor signals is input to the signal shaping unit 11. The signal shaping unit 11 can select one of the plurality of sensor signals and can shape the selected signal to generate the shaped signal. Thus, the similar shaped signal is generated in the case of one sensor 2.

Alternatively, the signal shaping unit 11 can synthesize the plurality of sensor signals to generate a synthesized signal and can shape the synthesized signal to generate a shaped signal. For example, the signal shaping unit 11 can switch from the selected signal to other sensor signal as a next selected signal to generate the synthesized signal each time the selected signal crosses other signal.

Figure 15:
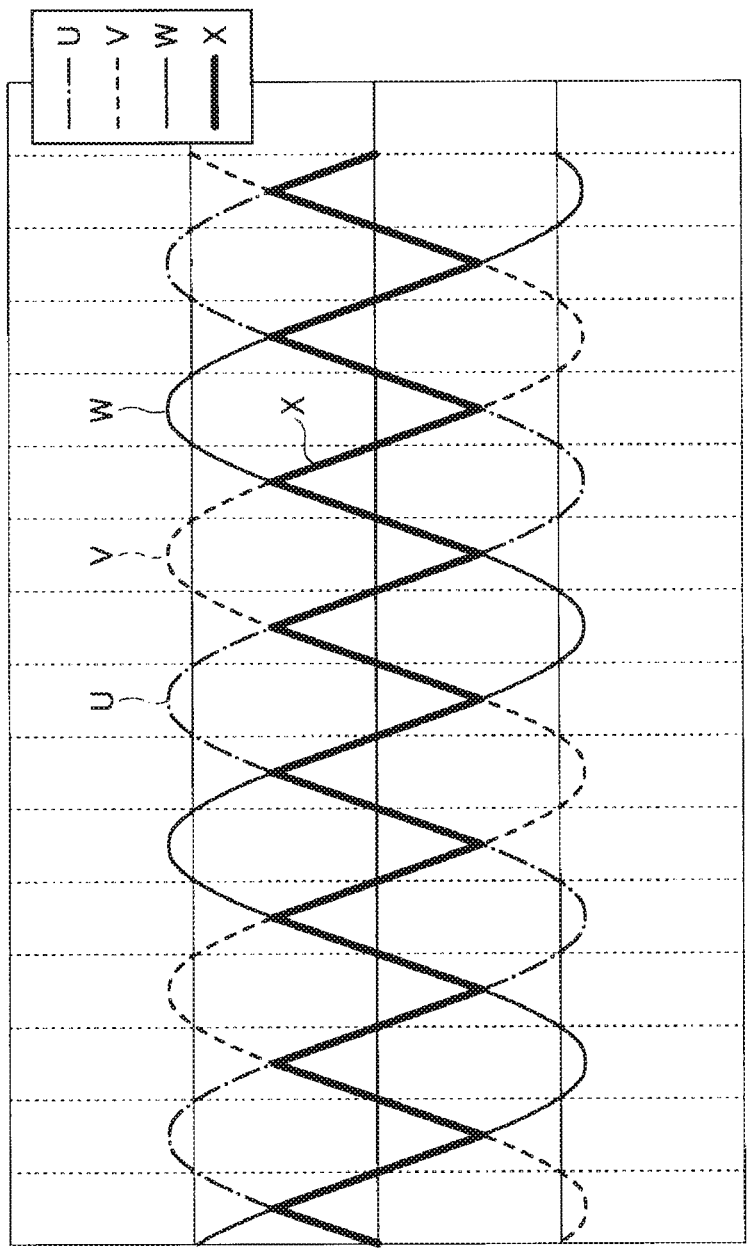
FIG. 15 is a graph illustrating an example of a sensor signal according to a fifth embodiment.

FIG. 15 is a graph illustrating an example of sensor signals in the case of three sensors 2 disposed around the motor M. In FIG. 0.15, the motor M is a three-phase brushless motor, and the three sensors 2 are disposed around the motor M corresponding to a U-phase, a V-phase, and a W-phase, respectively. The sensor signals U, V, and W of the three sensors 2 are sine waves having a difference in phase by 120 degrees with each other.

As illustrated in FIG. 15, since the sensor signals U, V, and W are sine waves, change of the phase with respect to change of the amplitude is large in the vicinity of the peak and the bottom. For this reason, a signal to noise (SN) ratio of the shaped signal generated based on one of the sensor signals U, V, and W deteriorates in the vicinity of the peak and the bottom.

Therefore, a synthesized signal X can be generated based on the sensor signals U, V, and W. The synthesized signal X is a signal connecting intersections of the sensor signals U, V, and W as illustrated in FIG. 15. The signal shaping unit 11 can select the sensor signal having a minimum amplitude among the sensor signals U, V, and W. When the selected signal crosses other sensor signal, the signal shaping unit 11 can switch from the selected signal to the other sensor signal as the next selected signal to generate the synthesized signal illustrated in FIG. 15. For generation of the synthesized signal X, the signal shaping unit 11 preferably includes a comparison circuitry to detect the intersections of the sensor signals U, V, and W, and a selector switch to switch the selected signal based on a comparison result.

As illustrated in FIG. 15, since the synthesized signal X is a signal connecting linear portions of the sensor signals U, V, and W, the shaped signal generated based on the synthesized signal X has the roughly constant SN ratio. The SN ratio of the shaped signal can be improved by the shaped signal generation based on the synthesized signal X, compared with that based on one of the sensor signals U, V, and W.

In addition, a maximum amplitude of the synthesized signal X is smaller than that of the sensor signals U, V, and W. Thus, an input range of the signal level detector 12 can become narrow by the shaped signal generation based on the synthesized signal X.

As described above, the synthesized signal generated based on the plurality of sensor signals and the shaped signal generated based on the synthesized signal can improve the SN ratio of the shaped signal and can narrow the input range of the signal level detector 12.

The signal shaping unit 11 can synthesize two sensor signals or more than three sensor signals to generate a synthesized signal. A generation method of the synthesized signal is not limited to above-described examples.

Figure 16:
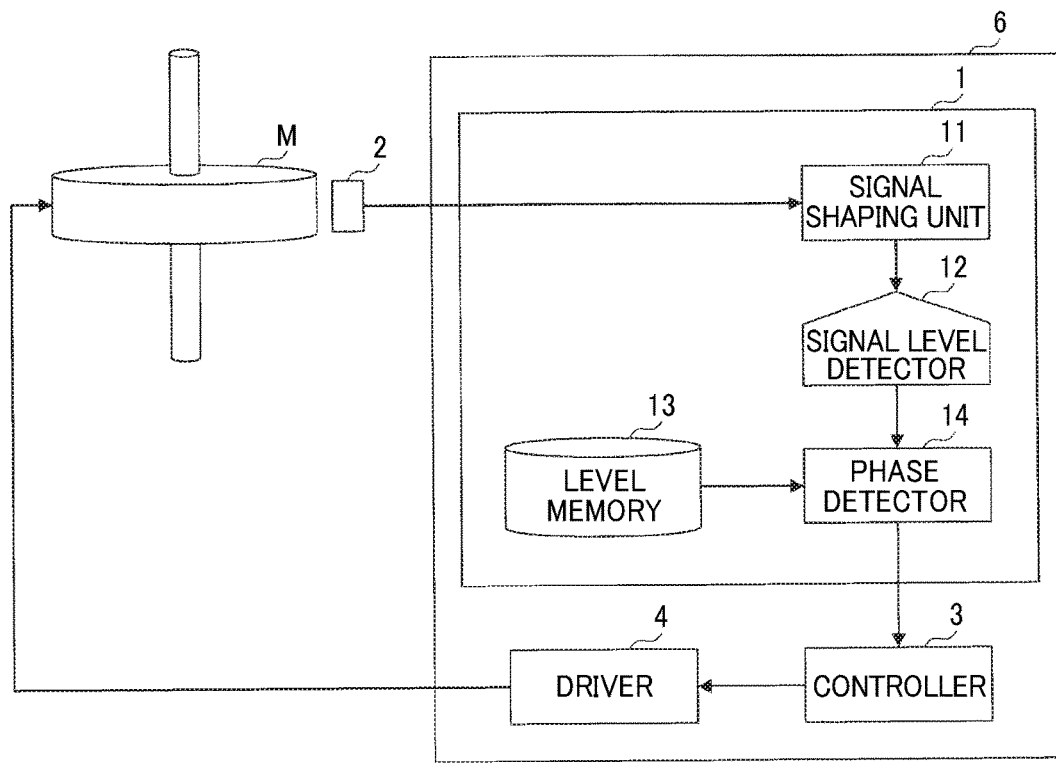
FIG. 16 is a schematic block diagram illustrating an example of a motor system according to a sixth embodiment of the present disclosure.
Figure 17:
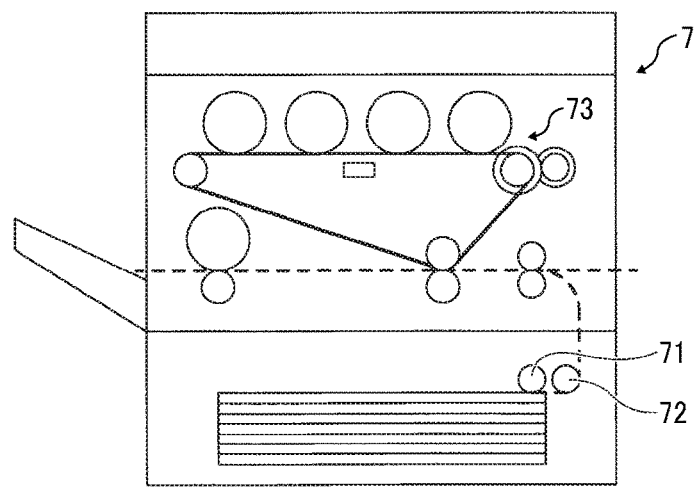
FIG. 17 is a schematic view illustrating an example of an image forming apparatus employing the motor system according to the sixth embodiment of the present disclosure.
Figure 18:
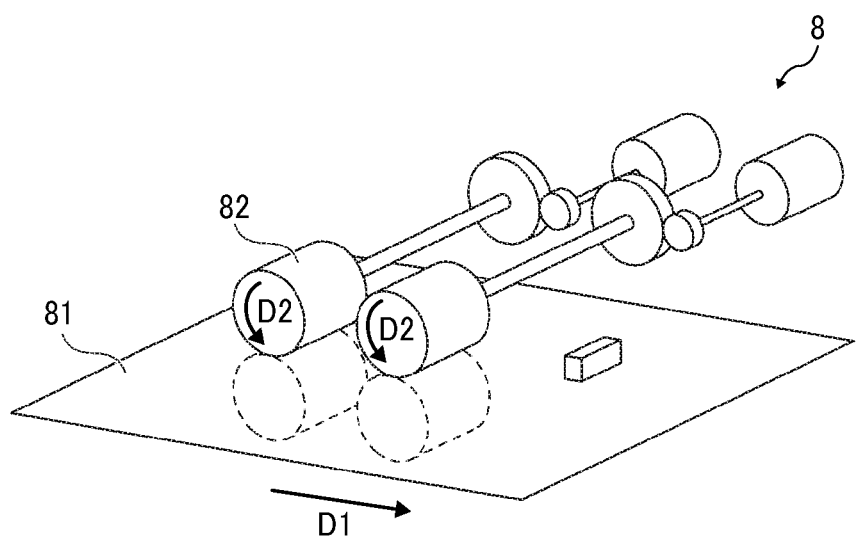
FIG. 18 is a perspective view illustrating an example of a conveyance device employing the motor system according to the sixth embodiment of the present disclosure.

Descriptions are given below of a motor system as a sixth embodiment of the present disclosure, with reference to FIGS. 16 to 18. FIG. 16 is a schematic block diagram illustrating a configuration of the motor system according to the present embodiment. The motor system in FIG. 16 includes the motor M, the sensor 2, and a motor driving controller 6.

The motor driving controller 6 includes the phase detecting device 1, the controller 3, and the driver 4. For example, the motor driving controller 6 includes a large scale integration (LSI).

The phase detecting device 1 can be the above-described phase detecting device 1 in any one of embodiments. The phase detecting device 1 detects the phase of the motor M and outputs the detected phase.

The controller 3 is the control circuitry for the motor M. The controller 3 controls drive of the motor M according to a control signal based on the phase of the motor M output from the phase detecting device 1. The control signal output from the controller 3 is input to the driver 4.

The driver 4 is the drive circuitry for the motor M. The driver 4 drives the motor M according to the control signal input from the controller 3.

As described above, the phase detecting device 1 can minimize the effect of the production tolerances and can detect the phase of the motor M accurately. Therefore, the phase detecting device 1 can control the motor M accurately according to the phase of the motor M detected by the phase detecting device 1.

The motor system according to the present embodiment can be used in an image forming apparatus. FIG. 17 is a schematic view illustrating an example of the image forming apparatus 7 employing the motor system according to the present embodiment. An image forming apparatus 7 in FIG. 17 has a printing function and includes an image forming device 73 to form an image on a sheet (i.e., a recording medium). The image forming apparatus 7 may include a scanner function, or a facsimile function, and the like. The image forming apparatus 7 includes rollers like a sheet feeding roller 71 and a sheet conveyance roller 72 to convey the sheet, and the like. The motor system according to the present embodiment can be used as the motor system for driving these rollers.

The motor system according to the present embodiment can be used as the conveyance device to convey a sheet-like object, such as a paper sheet, a bill, a prepreg, or a ticket. FIG. 18 is a perspective view illustrating an example of a conveyance device 8 employing the motor system according to present embodiment. The conveyance device 8 in FIG. 18 includes a conveyance roller 82 to convey the object 81 in a conveyance direction indicated by arrow D1. As the conveyance roller 82 rotate in a predetermined direction indicated by arrow D2, the object 81 is conveyed in the conveyance direction indicated by arrow D1. The motor system according to the present embodiment can be used as the motor system for driving these rollers.

The motor system according to the present embodiment is not limited to those used in the image forming apparatus 7 or the conveyance device 8, and may be used in any apparatus which employs a motor, such as a car, a robot, or an amusement machine.

The above-described embodiments are illustrative and do not limit the present disclosure. In regard to these points, the configuration can be modified without departing from the spirit of the present disclosure, and can be appropriately set according to an applied configuration.

Any one of the above-described operations may be performed in various other ways, for example, in an order different from the one described above. Each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

Any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

What is claimed is:

1. A phase detecting device configured to detect a phase of a rotor of a motor, the phase detecting device comprising:
    a signal level detector configured to
        detect a first level of a signal corresponding to the phase of the rotor of the motor;
    a level memory configured to store a preliminary level detected at each of a plurality of phases of the rotor as one of a plurality of second levels of the signal, each of the plurality of second levels of the signal corresponding to one of the plurality of phases of the rotor; and
    a phase detector configured to detect the phase of the rotor based on the first level input from the signal level detector and the plurality of second levels stored in the level memory,
    wherein the level memory is configured to
        store the preliminary level detected by the signal level detector at predetermined time intervals as one of the plurality of second levels of the signal at each of a plurality of predetermined phases of the rotor during constant speed rotation of an external motor coaxially coupled to the motor, or
        store the preliminary level of the signal detected by the signal level detector at predetermined time intervals as one of the plurality of second levels of the signal at each of a plurality of predetermined phases of the rotor during uncontrolled rotation of the motor, or
        store the preliminary level of the signal detected by the signal level detector at time when an external motor coaxially coupled to the motor is controlled to one of a plurality of predetermined phases of the rotor as one of the plurality of second levels of the signal at the at the one of the plurality of predetermined phases of the rotor.

2. The phase detecting device according to claim 1, further comprising a peak detector configured to detect a peak of the signal and notify the phase detector of the peak detection,
    wherein the phase detector specifies a start point to start detecting the phase of the rotor of the motor based on the peak detection by the peak detector.

3. The phase detecting device according to claim 1, the signal inputted to the signal level detector is a shaped signal that is shaped from a sensor signal a magnetic sensor or a synthesized signal synthesized from a plurality of sensor signals.

4. The phase detecting device according to claim 1, wherein the phase detector is configured to detect the phase of the rotor that corresponds to the one of the plurality of second levels of the signal closest to the first level of the signal as the phase of the rotor of the motor on detection of the first level of the signal.

5. A motor system comprising:
    the motor; and
    the phase detecting device according to the claim 1, configured to detect the phase of the rotor of the motor.

6. An image forming apparatus comprising:
    an image forming device to form an image on a sheet;
    a conveyance roller to convey the sheet; and
    the motor system according to claim 5, configured to drive the conveyance roller.

7. A conveyance device comprising:
    a conveyance roller to convey an object; and the motor system according to claim 5, configured to drive the conveyance roller.

8. A phase detecting device configured to detect a phase of a rotor of a motor, the phase detecting device comprising:

circuitry configured to
detect a first level of a signal corresponding to the phase of the rotor of the motor; and a level memory configured to store a preliminary level detected at each of a plurality of phases of the rotor as one of a plurality of second levels of the signal, each of the plurality of second levels of the signal corresponding to one of the plurality of phases of the rotor, the circuitry configured to detect the phase of the rotor based on the first level of the signal and the plurality of second levels stored in the level memory, wherein the level memory is configured to
store the preliminary level detected by the circuitry at predetermined time intervals as one of the plurality of second levels of the signal at each of a plurality of predetermined phases of the rotor during constant speed rotation of an external motor coaxially coupled to the motor, or store the preliminary level of the signal detected by the circuitry at predetermined time intervals as one of the plurality of second levels of the signal at each of a plurality of predetermined phases of the rotor during uncontrolled rotation of the motor, or the preliminary level by the circuitry when an external motor coaxially coupled to the motor controlled to one of a plurality of predetermined phases of the rotor as one of the plurality of second levels of the signal at the at the one of the plurality of predetermined phases of the rotor.

9. A method for obtaining a sensor level to detect a phase of a rotor of a motor, the method comprising:

detecting a first level of a signal corresponding to the phase of the rotor of the motor during constant speed rotation of the motor;

storing a plurality of preliminary levels of the signal detected at predetermined time intervals as a plurality of second levels of the signal, each of the plurality of second levels corresponding to one of a plurality of phases of the rotor; and detecting the phase of the rotor based on the first level of the signal and the plurality of second levels of the signal, wherein the storing includes storing the preliminary level detected at predetermined time intervals as one of the plurality of second levels of the signal at each of a plurality of predetermined phases of the rotor during constant speed rotation of an external motor coaxially coupled to the motor, or storing the preliminary level of the signal detected at predetermined time intervals as one of the plurality of second levels of the signal at each of a plurality of predetermined phases of the rotor during uncontrolled rotation of the motor, or store the preliminary level of the signal detected at time when an external motor coaxially coupled to the motor is controlled to one of a plurality of predetermined phases of the rotor as one of the plurality of second levels of the signal at the at the one of the plurality of predetermined phases of the rotor.

* * * * *